US008829511B2

(12) United States Patent
Hsieh et al.

(10) Patent No.: US 8,829,511 B2
(45) Date of Patent: Sep. 9, 2014

(54) HYBRID THIN FILM TRANSISTOR, MANUFACTURING METHOD THEREOF AND DISPLAY PANEL HAVING THE SAME

(75) Inventors: Hsiu-Chun Hsieh, Hsinchu (TW);
Yi-Wei Chen, Hsinchu County (TW);
Ta-Wei Chiu, Changhua County (TW);
Chung-Tao Chen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 79 days.

(21) Appl. No.: 13/234,119

(22) Filed: Sep. 15, 2011

(65) Prior Publication Data
US 2012/0305910 A1    Dec. 6, 2012

(30) Foreign Application Priority Data
Jun. 2, 2011    (TW) .............................. 100119405 A

(51) Int. Cl.
*H01L 29/786*    (2006.01)
*H01L 27/12*    (2006.01)

(52) U.S. Cl.
CPC ........ *H01L 27/1225* (2013.01); *H01L 27/1251* (2013.01); *H01L 27/1222* (2013.01)
USPC .................................... 257/43; 257/E29.273

(58) Field of Classification Search
USPC ............................................. 257/43, E29.273
See application file for complete search history.

(56) References Cited

U.S. PATENT DOCUMENTS

| 6,670,230 | B2 | 12/2003 | Hsieh | |
|---|---|---|---|---|
| 7,544,967 | B2 | 6/2009 | Kim et al. | |
| 8,268,654 | B2 * | 9/2012 | Fujikawa et al. | 438/30 |
| 8,378,343 | B2 * | 2/2013 | Yamazaki et al. | 257/43 |
| 2002/0009835 | A1 * | 1/2002 | Chen et al. | 438/149 |
| 2004/0009835 | A1 * | 1/2004 | Heim | 474/78 |
| 2004/0263444 | A1 * | 12/2004 | Kimura | 345/82 |

(Continued)

FOREIGN PATENT DOCUMENTS

| JP | 2009004733 | | 1/2009 |
|---|---|---|---|
| WO | 2011056710 | A2 | 5/2011 |

OTHER PUBLICATIONS

Y. Ogo et al., "Tin monoxide as an s-orbital-based p-type oxide semiconductor: Electronic structures and TFT application", Phys. Status Solidi A 206, No. 9, Jul. 29, 2009, p. 2187-2191.

(Continued)

*Primary Examiner* — Matthew W Such
*Assistant Examiner* — Ali Naraghi
(74) *Attorney, Agent, or Firm* — Jianq Chyun IP Office

(57) ABSTRACT

A hybrid thin film transistor includes a first thin film transistor and a second thin film transistor. The first thin film transistor includes a first gate, a first source, a first drain and a first semiconductor layer disposed between the first gate, the first source and the first drain, and the first semiconductor layer includes a crystallized silicon layer. The second thin film transistor includes a second gate, a second source, a second drain and a second semiconductor layer disposed between the second gate, the second source and the second drain, and the second semiconductor layer includes a metal oxide semiconductor layer.

24 Claims, 17 Drawing Sheets

(56) References Cited

U.S. PATENT DOCUMENTS

| | | | |
|---|---|---|---|
| 2007/0057261 A1* | 3/2007 | Jeong et al. | 257/77 |
| 2008/0303030 A1* | 12/2008 | Sakai et al. | 257/72 |
| 2009/0153056 A1* | 6/2009 | Chen et al. | 315/51 |
| 2010/0182223 A1* | 7/2010 | Choi et al. | 345/76 |
| 2010/0213461 A1* | 8/2010 | Akimoto et al. | 257/43 |
| 2010/0304546 A1* | 12/2010 | Ogawa et al. | 438/401 |
| 2011/0269274 A1* | 11/2011 | Furuta et al. | 438/158 |
| 2011/0304546 A1* | 12/2011 | Rea | 345/163 |

OTHER PUBLICATIONS

Y. Ogo et al., "P-channel thin-film transistor using p-type oxide semiconductor, SnO", Applied Physics Letters 93, 032113 (2008), Jul. 25, 2008, p. 1-3.

Ou et al., "Anomalous p-channel amorphous oxide transistors based on tin oxide and their complementary circuits", Applied Physics Letters 92, 122113 (2008), Mar. 28, 2008, p. 1-3.

"Third Office Action of China Counterpart Application", issued on Aug. 12, 2013, p1-p10, in which the listed reference was cited.

* cited by examiner

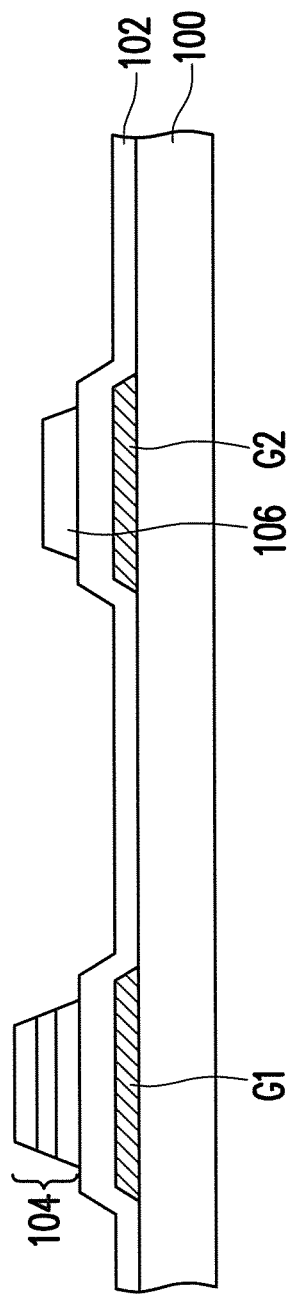
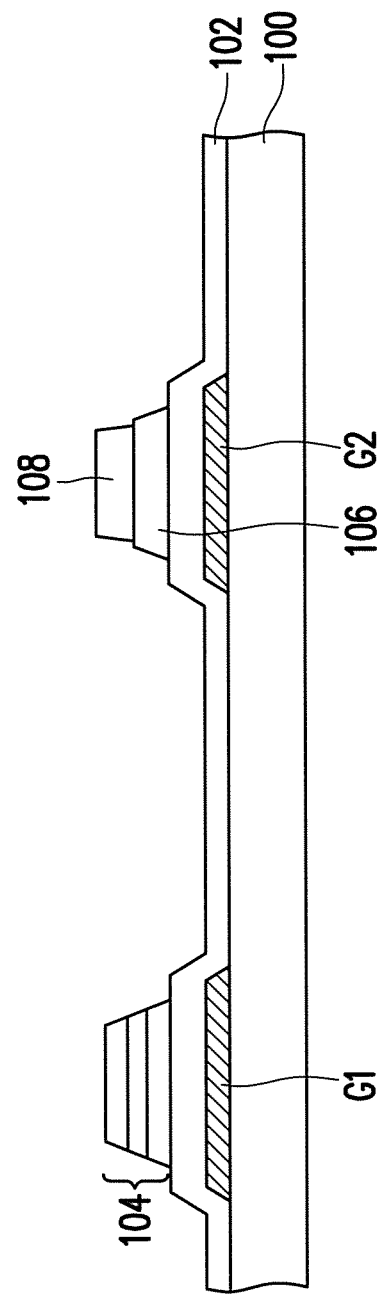

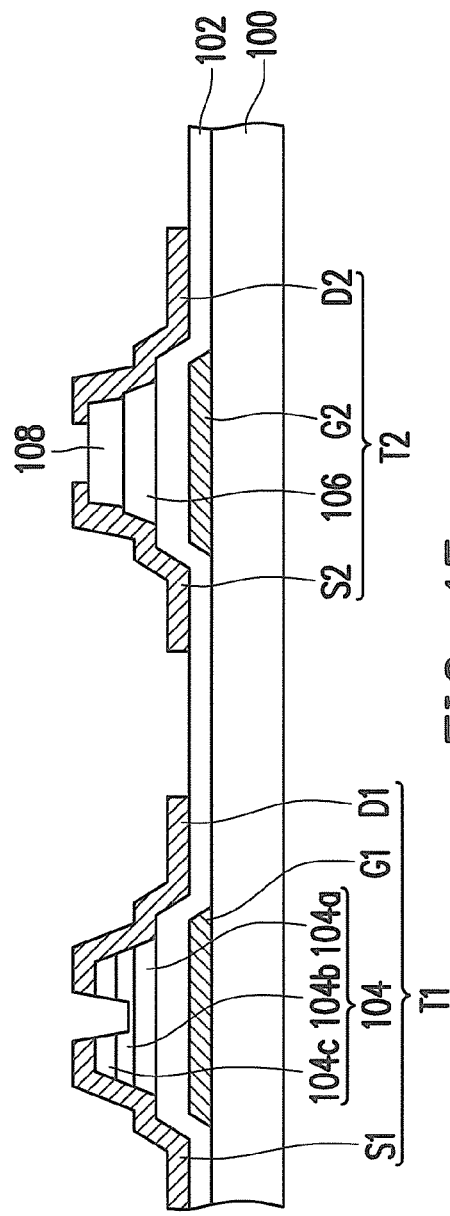
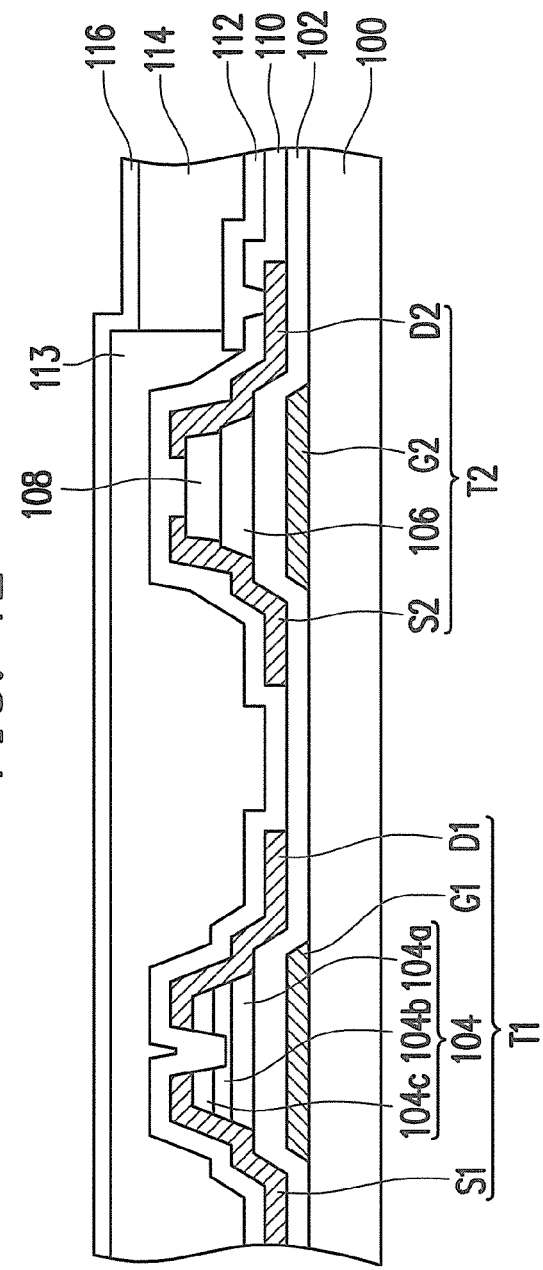

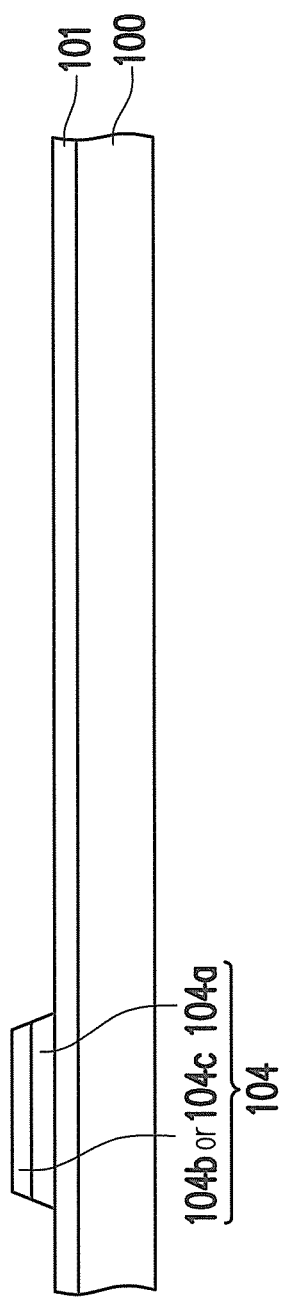
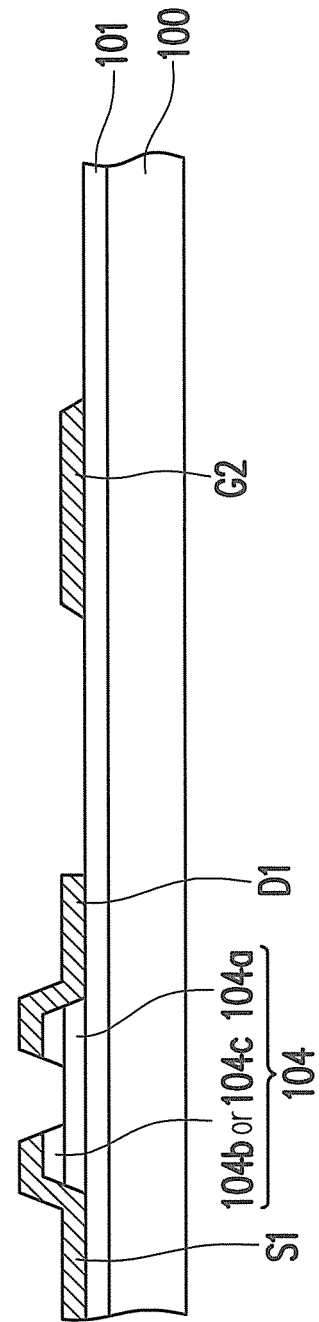
FIG. 3A
FIG. 3B

HYBRID THIN FILM TRANSISTOR, MANUFACTURING METHOD THEREOF AND DISPLAY PANEL HAVING THE SAME

CROSS-REFERENCE TO RELATED APPLICATION

This application claims the priority benefit of Taiwan application serial no. 100119405, filed Jun. 2, 2011. The entirety of the above-mentioned patent application is hereby incorporated by reference herein and made a part of this specification.

BACKGROUND OF THE INVENTION

1. Field of the Invention

The present invention relates to a hybrid thin film transistor, a method of manufacturing the hybrid thin film transistor, and a display panel having the hybrid thin film transistor.

2. Description of Related Art

As modern information technology advances, various types of displays have been widely used in screens for consumer electronic products such as mobile phones, notebook computers, digital cameras, and personal digital assistants (PDAs). Among these displays, liquid crystal displays (LCD) and organic electroluminescence displays (OELD) are the prevailing products in the market due to their advantages of being light-weight, compact, and low in power-consumption. The manufacturing process for both LCD and OELD includes forming semiconductor devices arranged in array on a substrate and the semiconductor devices include thin film transistors (TFTs).

Conventionally, thin film transistors include amorphous TFTs and low temperature poly-silicon TFTs. The amorphous TFTs have a disadvantage of that the channel has lower carrier mobility and is not stable, and thus the amorphous TFTs are difficult to apply in driving circuits. The low temperature poly-silicon TFTs have higher carrier mobility comparing with the amorphous TFTs and are suitable for applying in the driving circuits. However, the process for the low temperature poly-silicon TFTs is complex and the manufacturing cost is high.

SUMMARY OF THE INVENTION

Accordingly, the present invention is directed to a hybrid thin film transistor, a manufacturing method thereof, and a display panel having the same which have advantages of high carrier mobility and low manufacturing cost.

A hybrid thin film transistor includes a first thin film transistor and a second thin film transistor. The first thin film transistor comprises a first gate, a first source, a first drain and a first semiconductor layer disposed between the first gate, the first source and the first drain, and the first semiconductor layer includes a crystallized silicon layer. The second thin film transistor includes a second gate, a second source, a second drain and a second semiconductor layer disposed between the second gate, the second source and the second drain, and the second semiconductor layer includes a metal oxide semiconductor layer.

A method of manufacturing a hybrid thin film transistor is provided. The method includes forming a first thin film transistor on a substrate, the first thin film transistor comprising a first gate, a first source, a first drain and a first semiconductor layer disposed between the first gate, the first source and the first drain, wherein the first semiconductor layer comprises a crystallized silicon layer; and forming a second thin film transistor on a substrate, the second thin film transistor comprising a second gate, a second source, a second drain and a second semiconductor layer disposed between the second gate, the second source and the second drain, wherein the second semiconductor layer includes a metal oxide semiconductor layer.

A display panel having a display region and a peripheral region around the display region is provided. The display panel comprises a pixel array disposed in the display region and at least one driving device disposed in at least one of the display region and the peripheral region, wherein the at least one driving device is a hybrid thin film transistor as above mentioned.

In light of the foregoing, the hybrid thin film transistor is formed by a crystallized silicon thin film transistor (the first thin film transistor) and a metal oxide thin film transistor (the second thin film transistor). Comparing with the conventional amorphous thin film transistor, the hybrid thin film transistor of the present invention has higher carrier mobility. Comparing with the conventional low temperature poly-silicon thin film transistor, the manufacturing process for the hybrid thin film transistor of the present invention is simpler. Therefore, the hybrid thin film transistor of the present invention is suitable for applying in driving circuits, pixel units or both of them, and the manufacturing cost is low.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

FIG. 1A to FIG. 1F are schematic cross-sectional diagrams showing a method of manufacturing a hybrid thin film transistor according to an embodiment of the present invention.

FIG. 3A to FIG. 3E are schematic cross-sectional diagrams showing a method of manufacturing a hybrid thin film transistor according to another embodiment of the present invention.

DESCRIPTION OF EMBODIMENTS

A hybrid thin film transistor in the present invention comprises a first thin film transistor and a second thin film transistor, wherein a first semiconductor layer of the first thin film transistor comprises a crystallized silicon layer, and a second semiconductor layer of the second thin film transistor comprises a metal oxide semiconductor layer. The first thin film transistor and the second thin film transistor are respectively a bottom gate thin film transistor or a top gate thin film transistor. In the following, several embodiments are provided to describe the structure and the manufacturing method of the hybrid thin film transistor.

Figure 1A:
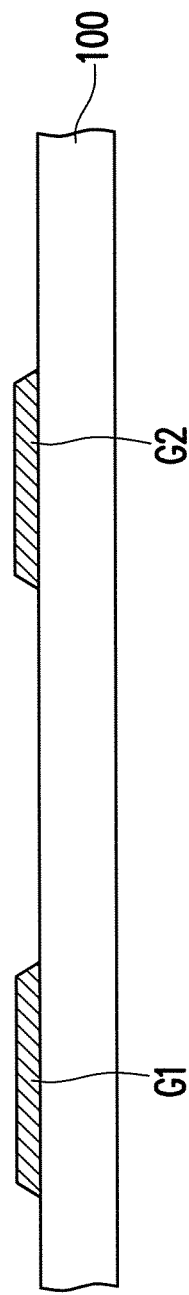

FIG. 1A to FIG. 1F are schematic cross-sectional diagrams showing a method of manufacturing a hybrid thin film transistor according to an embodiment of the present invention. Referring to FIG. 1A, the method of manufacturing a hybrid thin film transistor in the embodiment comprises forming a first gate G1 and a second gate G2 on a substrate 100. The substrate 100 can be made of glass, quartz, an organic polymer, an opaque/reflective material (such as a conductive material, metal, wafer, ceramics, or any other appropriate material), or any other appropriate material. The first gate G1 and the second gate G2 are formed, for example, by depositing a conductive layer on the substrate 100 and patterning the conductive layer with a photolithography process and an etching process. In consideration of electrical conductivity, the first gate G1 and the second gate G2 are often made of metal materials. However, the invention is not limited thereto. According to other embodiments of the invention, the first gate G1 and the second gate G2 can also be made of other conductive materials. The metal material includes, for example, an alloy, metal nitride, metal oxide, metal oxynitride, another appropriate material, or a layer in which the metal material and any other conductive material are stacked to each other.

Figure 1B:
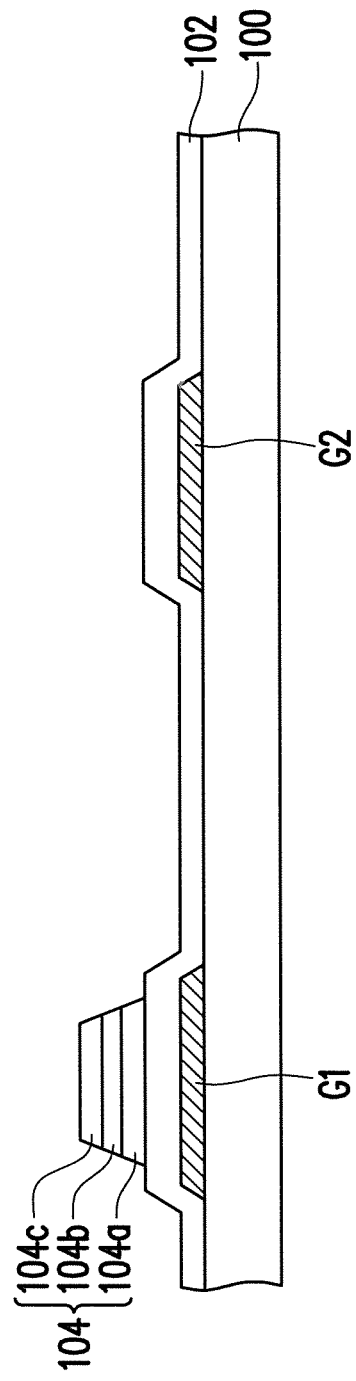

As shown in FIG. 1B, an insulating layer 102 is formed on the substrate 100 to cover the first gate G1 and the second gate G2. The insulating layer 102 can be made of an inorganic material (such as silicon oxide, silicon nitride, or silicon oxynitride), an organic material or a stacked layer containing the insulating material and any other insulating material.

A first semiconductor layer 104 is formed on the insulating layer 102 above the first gate G1, and the first semiconductor layer 104 comprises the crystallized silicon layer 104a. The crystallized silicon layer 104a comprises a poly-silicon material, a microcrystalline silicon material or other crystallized silicon materials. According to the embodiment, in addition to the crystallized silicon layer 104a, the first semiconductor layer 104 further comprises a silicon layer 104b and/or a doped amorphous silicon layer 104c.

In the embodiment showing in FIG. 1A to FIG. 1F, the first semiconductor layer 104 comprises the crystallized silicon layer 104a, the silicon layer 104b and the doped amorphous silicon layer 104c. The silicon layer 104b comprises a microcrystalline silicon material or an amorphous silicon material, which are not doped with ions or dopants. The doped amorphous silicon layer 104c comprises an amorphous silicon material doped with a p-type dopant or an amorphous silicon material doped with an n-type dopant. According to the embodiment, the crystallized silicon layer 104a, the silicon layer 104b and the doped amorphous silicon layer 104c are formed by depositing an amorphous silicon material, and then performing a laser annealing process to transform the amorphous silicon material into a crystallized silicon material. Next, a silicon material and a doped amorphous silicon material are sequentially formed on the crystallized silicon material, and a photolithography process and an etching process are performed to pattern the above film layers so as to form the first semiconductor layer 104.

Referring to FIG. 1C, a second semiconductor layer 106 is formed on the insulating layer 102 above the second gate G2. The second semiconductor layer 106 includes a metal oxide semiconductor layer. According to the embodiment, the second semiconductor layer 106 is formed by depositing a metal oxide semiconductor material and performing a photolithography process and an etching process to pattern the metal oxide semiconductor material. In addition, the semi-conductive type of the second semiconductor layer 106 is complementary to the semi-conductive type of the doped amorphous silicon layer 104c of the first semiconductor layer 104. In other words, if the doped amorphous silicon layer 104c comprises an amorphous silicon material doped with a p-type dopant, the second semiconductor layer 106 comprises an n-type metal oxide semiconductor material, such as indium-gallium-zinc oxide (IGZO), zinc oxide (ZnO), indium-zinc oxide (IZO), gallium-zinc oxide (GZO), zinc-tin oxide (ZTO) or indium-tin oxide (ITO). If the doped amorphous silicon layer 104c comprises an amorphous silicon material doped with an n-type dopant, the second semiconductor layer 106 comprises a p-type metal oxide semiconductor material, such as tin oxide (SnO), cupper-aluminum-gallium-indium oxide, tin-aluminum-indium oxide, $SrCu_2O_2$, LaCuOS or LaCuOSe.

As shown in FIG. 1D, an etching stop layer 108 is formed on the second semiconductor layer 106. The etching stop layer 106 may protect the second semiconductor later 106 from the damages of etching gases or etching solutions in the subsequent processes. Therefore, if the etching processes are controlled well, the etching stop layer 108 may also be omitted.

As shown in FIG. 1E, a first source S1 and a first drain D1 are formed on the first semiconductor layer 104, and a second source S2 and a second drain D2 are foamed on the second semiconductor layer 106. The first source S1, the first drain D1, the second source S2 and the second drain D2 are formed, for example, by depositing a conductive layer and patterning the conductive layer with a photolithography process and an etching process. In the patterning step, the doped amorphous silicon layer 104c between the first source S1 and the first drain D1 is also removed, so as to expose the silicon layer 104b or the crystallized silicon layer 104a. The doped amorphous silicon layer 104c remained between the first source S1 and the crystallized silicon layer 104a and remained between the first drain D1 and he crystallized silicon layer 104a serves as an ohmic contact layer. Moreover, since the etching stop layer 108 is disposed on the second semiconductor layer 106, it protects the second semiconductor layer 106 from the damage of the etching process. In addition, in consideration of electrical conductivity, the first source S1, the first drain D1, the second source S2 and the second drain D2 are often made of metal materials. However, the invention is not limited thereto. According to other embodiments of the invention, the first source S1, the first drain D1, the second source S2 and the second drain D2 can also be made of other conductive materials. The metal material includes, for example, an alloy, metal nitride, metal oxide, metal oxynitride, another appropriate material, or a layer in which the metal material and any other conductive material are stacked to each other.

It is noted that in the embodiment shown in FIG. 1A to FIG. 1E, the first semiconductor layer 104 is a three layer structure composing of the crystallized silicon layer 104a, the silicon layer 104b and the doped amorphous silicon layer 104c, which should not be construed as a limitation to the invention. According to another embodiment, the first semiconductor layer 104 may also be a double layer structure composing of the crystallized silicon layer 104a and the silicon layer 104b or a double layer structure composing of the crystallized silicon layer 104a and the doped amorphous silicon layer 104c.

After the above steps are finished, a hybrid thin film transistor is formed, as shown in FIG. 1E, which comprises a first thin film transistor T1 and a second thin film transistor T2. The first thin film transistor T1 includes a first gate G1, a first source S1, a first drain D1 and a first semiconductor layer 104, and the first semiconductor layer 104 includes a crystallized silicon layer 104a. In the embodiment, the first semiconductor layer 104 further comprises a silicon layer 104b and a doped amorphous silicon layer 104c. The second thin film transistor T2 includes a second gate G2, a second source S2, a second drain D2 and a second semiconductor layer 106, and the second semiconductor layer 106 includes a metal oxide semiconductor layer. The first thin film transistor T1 and the second thin film transistor T2 in the embodiment are respectively a bottom gate thin film transistor, and the hybrid thin film transistor may be applied in a driving circuit or a pixel unit of a display panel.

If the hybrid thin film transistor is applied in a pixel unit of a display panel, the step shown in FIG. 1F is performed after FIG. 1E.

As shown in FIG. 1F, a passivation layer 110 is formed on the substrate 100 to cover the first thin film transistor T1 and the second thin film transistor T2. The passivation layer 110 can be made of an inorganic material (such as silicon oxide, silicon nitride, or silicon oxynitride), an organic material or a stacked layer containing the insulating material and any other insulating material. A first electrode layer 112 electrically connected to the second drain D2 of the second thin film transistor T2 is formed on the passivation layer 110. The first electrode layer 112 comprises indium-tin oxide (ITO), indium-zinc oxide (IZO), gallium-zinc oxide (GZO), zinc-tin oxide (ZTO), indium-gallium-zinc oxide (IGZO), a metal oxide material or a stacked layer containing the metal oxide material. A planarization layer 113 is formed on the passivation layer 110 and exposes the first electrode layer 112. A light emitting layer 114 is formed on the exposed first electrode layer 112, and a second electrode layer 116 is formed on the light emitting layer 114. The first electrode layer 112, the light emitting layer 114 and the second electrode layer 116 form an electroluminescence device, and the first thin film transistor T1 and the second thin film transistor T2 control the electroluminescence device to emit light or not.

Figure 2A:
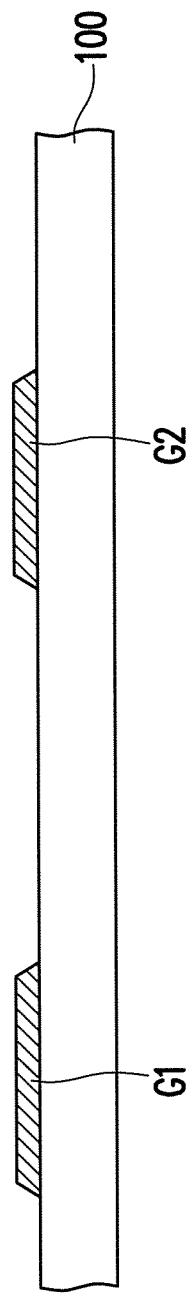
FIG. 2A to FIG. 2E are schematic cross-sectional diagrams showing a method of manufacturing a hybrid thin film transistor according to another embodiment of the present invention.

FIG. 2A to FIG. 2E are schematic cross-sectional diagrams showing a method of manufacturing a hybrid thin film transistor according to another embodiment of the present invention. The embodiment depicted in FIG. 2A to FIG. 2E is similar to the embodiment depicted in FIG. 1A to FIG. 1F, and the same components indicated in FIG. 1A to FIG. 1F are denoted by the same numerals and are not repeated herein. As shown in FIG. 2A, the method of manufacturing a hybrid thin film transistor in the embodiment comprises forming a first gate G1 and a second gate G2 on a substrate 100.

Figure 2B:
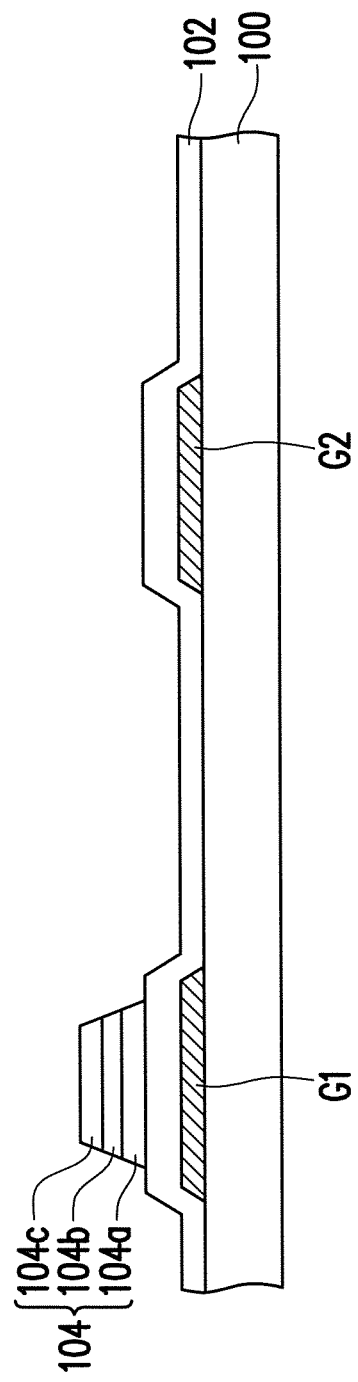

Referring to FIG. 2B, an insulating layer 102 is formed on the substrate 100 to cover the first gate G1 and the second gate G2. A first semiconductor layer 104 is formed on the insulating layer 102 above the first gate G1, and the first semiconductor layer 104 comprises a crystallized silicon layer 104a. The crystallized silicon layer 104a comprises a poly-silicon material, a microcrystalline silicon material or other crystallized silicon materials. According to the embodiment, in addition to the crystallized silicon layer 104a, the first semiconductor layer 104 further comprises a silicon layer 104b and a doped amorphous silicon layer 104c. The silicon layer 104b comprises a microcrystalline silicon material or an amorphous silicon material, and the doped amorphous silicon layer 104c comprises an amorphous silicon material doped with a p-type dopant or an amorphous silicon material doped with an n-type dopant.

Figure 2C:
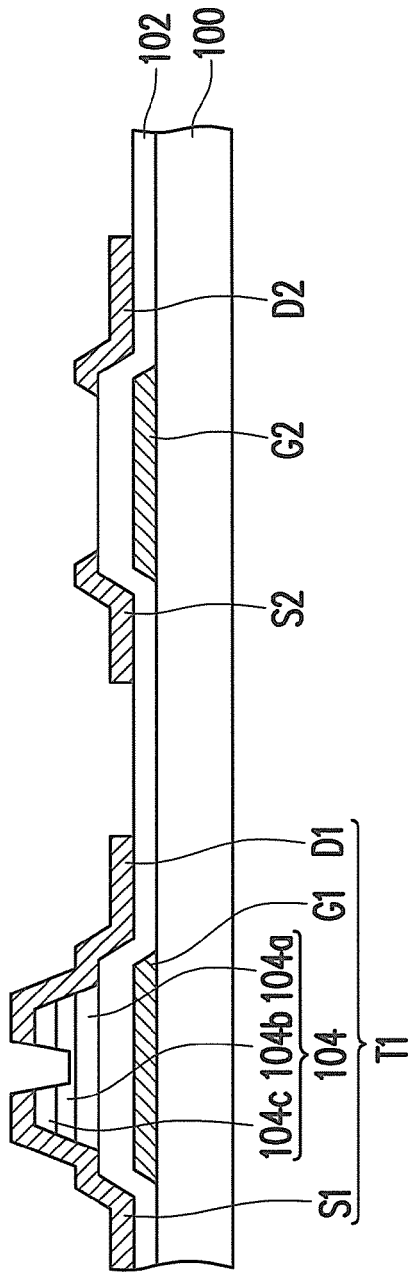

As shown in FIG. 2C, a first source S1 and a first drain D1 are formed on the first semiconductor layer 104, and a second source S2 and a second drain D2 are formed on the insulating layer 102 besides the second gate G2.

Figure 2D:
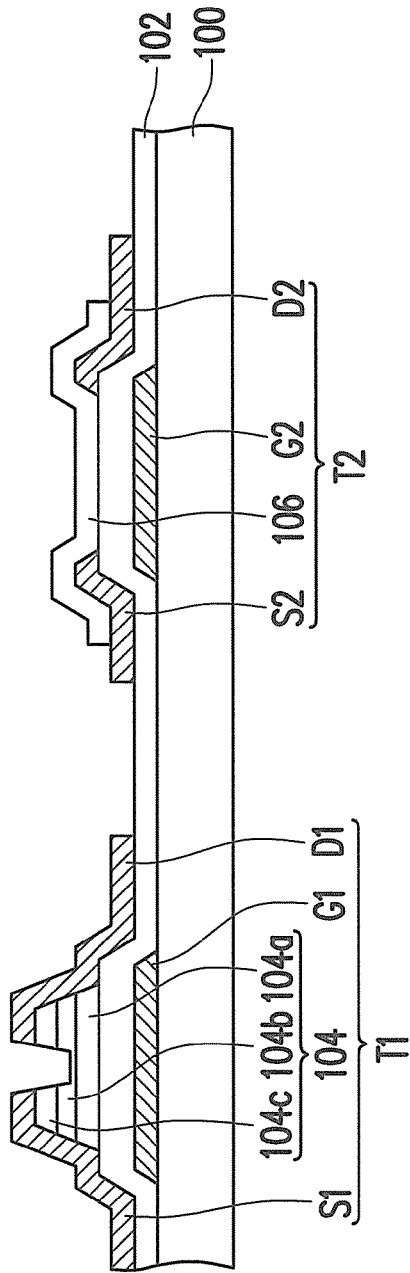

Referring to FIG. 2D, a second semiconductor layer 106 is formed on the second source S2, the second drain D2 and the insulating layer 102 above the second gate G2. The second semiconductor layer 106 comprises an n-type metal oxide semiconductor material or a p-type metal oxide semiconductor material based on the semi-conductive type of the doped amorphous silicon layer 104c of the first semiconductor layer 104, so as to form a hybrid thin film transistor composing of a first thin film transistor T1 and a second thin film transistor T2. In the embodiment, the first thin film transistor T1 and the second thin film transistor T2 are respectively a bottom gate thin film transistor, and the hybrid thin film transistor may be applied in a driving circuit or a pixel unit of a display panel.

It is noted that in the embodiment shown in FIG. 2A to FIG. 2D, the first semiconductor layer 104 is a three layer structure composing of the crystallized silicon layer 104a, the silicon layer 104b and the doped amorphous silicon layer 104c, which should not be construed as a limitation to the invention. According to another embodiment, the first semiconductor layer 104 may also be a double layer structure composing of the crystallized silicon layer 104a and the silicon layer 104b or a double layer structure composing of the crystallized silicon layer 104a and the doped amorphous silicon layer 104c.

Figure 2E:
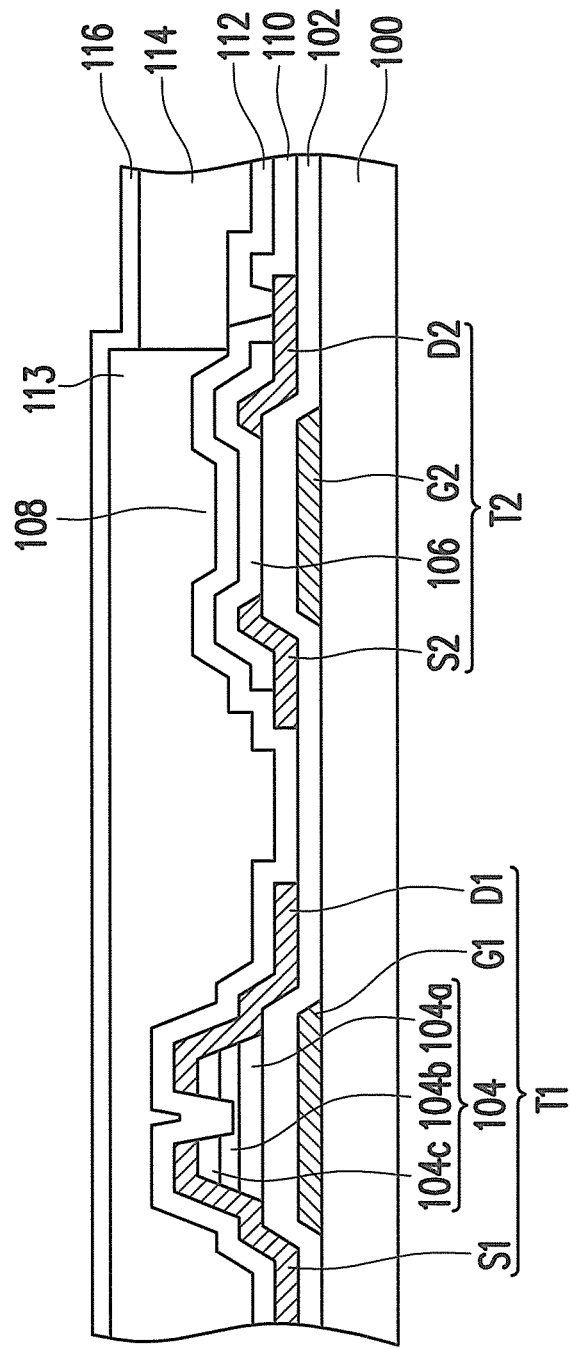

If the hybrid thin film transistor is applied in a pixel unit of a display panel, the step shown in FIG. 2E is further performed after FIG. 2D. That is, a passivation layer 110 is formed on the substrate 100 to cover the first thin film transistor T1 and the second thin film transistor T2. A first electrode layer 112 electrically connected to the second drain D2 of the second thin film transistor T2 is formed on the passivation layer 110. A planarization layer 113 is formed on the passivation layer 110 and exposes the first electrode layer 112. A light emitting layer 114 is formed on the exposed first electrode layer 112, and a second electrode layer 116 is formed on the light emitting layer 114. The first electrode layer 112, the light emitting layer 114 and the second electrode layer 116 form an electroluminescence device.

Figure 3C:
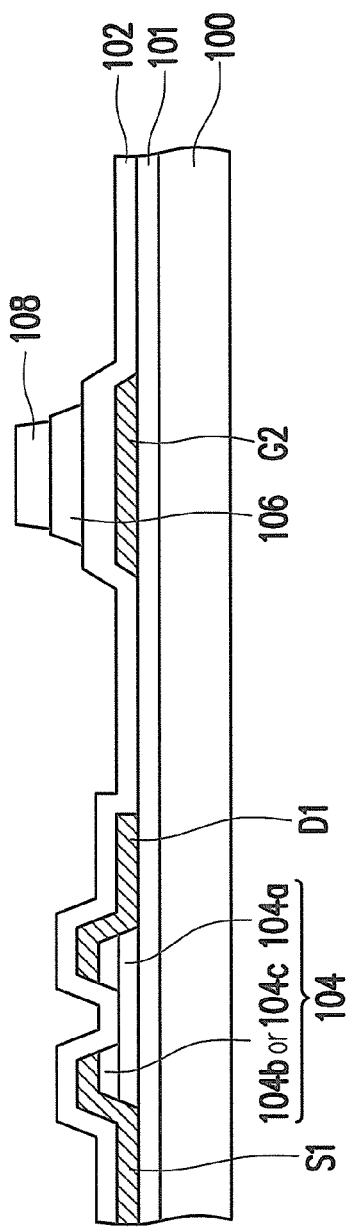

FIG. 3A to FIG. 3E are schematic cross-sectional diagrams showing a method of manufacturing a hybrid thin film transistor according to another embodiment of the present invention. The embodiment depicted in FIG. 3A to FIG. 3E is similar to the embodiment depicted in FIG. 1A to FIG. 1F, and the same components indicated in FIG. 1A to FIG. 1F are denoted by the same numerals and are not repeated herein. As shown in FIG. 3A, the method of manufacturing a hybrid thin film transistor in the embodiment comprises forming a buffer layer 101 on a substrate 100 and forming a first semiconductor layer 104 on the buffer layer 101. The first semiconductor layer 104 comprises a crystallized silicon layer 104a which comprises a poly-silicon material, a microcrystalline silicon material or other crystallized silicon materials. According to the embodiment, the first semiconductor layer 104 further comprises a silicon layer 104b or a doped amorphous silicon layer 104c. The silicon layer 104b comprises a microcrystalline silicon material or an amorphous silicon material, and the doped amorphous silicon layer 104c comprises an amorphous silicon material doped with a p-type dopant or an amorphous silicon material doped with an n-type dopant. In the embodiment, the crystallized silicon layer 104a and the silicon layer 104b (or the doped amorphous silicon layer 104c) are formed by depositing an amorphous silicon material, and then performing a laser annealing process to transform the amorphous silicon material into a crystallized silicon material. Next, a silicon material (or a doped amorphous silicon material) is formed on the crystallized silicon material, and then a photolithography process and an etching process are performed to pattern the above film layers so as to form the first semiconductor layer 104 having an island shape.

As shown in FIG. 3B, a first source S1 and a first drain D1 are formed on the first semiconductor layer 104, and a second gate G2 is formed on the buffer layer 101. The first source S1, the first drain D1 and the second gate G2 are formed, for example, by depositing a conductive layer and patterning the conductive layer with a photolithography process and an etching process. In the patterning step, the silicon layer 104b (or the doped amorphous silicon layer 104c) between the first source S1 and the first drain D1 is also removed, so as to expose the crystallized silicon layer 104a.

Referring to FIG. 3C, an insulating layer 102 is formed on the buffer layer 101 to cover the first semiconductor layer 104, the first source S1, the first drain D1 and the second gate G2. A second semiconductor layer 106 is formed on the insulating layer 102 above the second gate G2. The second semiconductor layer 106 comprises an n-type metal oxide semiconductor material or a p-type metal oxide semiconductor material. If the doped amorphous silicon layer 104c of the first semiconductor layer 104 comprises an amorphous silicon material doped with a p-type dopant, the second semiconductor layer 106 comprises an n-type metal oxide semiconductor material. If the doped amorphous silicon layer 104c of the first semiconductor layer 104 comprises an amorphous silicon material doped with an n-type dopant, the second semiconductor layer 106 comprises a p-type metal oxide semiconductor material. In the embodiment, an etching stop layer 108 is further formed on the second semiconductor layer 106. The etching stop layer 106 may protect the second semiconductor later 106 from the damages of the subsequent processes. However, if the etching processes are controlled well, the etching stop layer 108 may also be omitted.

Figure 3D:
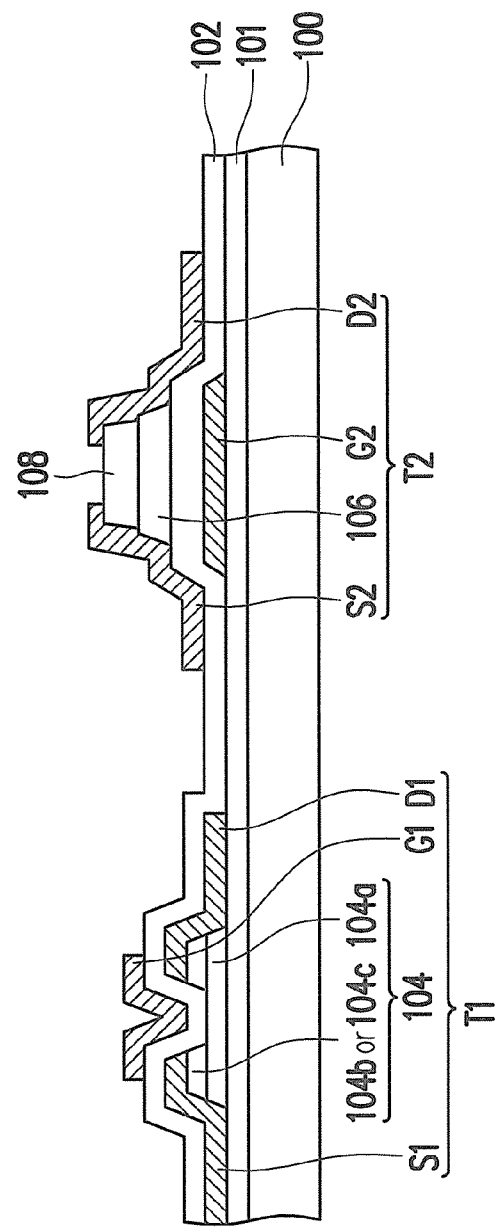

As shown in FIG. 3D, a first gate G1 is formed on the insulating layer 102 above the first semiconductor layer 104, and a second source S2 and a second drain D2 are formed on the second semiconductor layer 106. The first gate G1, the second source S2 and the second drain D2 are formed, for example, by depositing a conductive layer and patterning the conductive layer with a photolithography process and an etching process.

After the above steps are finished, a hybrid thin film transistor which includes a first thin film transistor T1 and a second thin film transistor T2 is formed. The first thin film transistor T1 is a top gate thin film transistor, while the second thin film transistor T2 is bottom gate thin film transistor. The hybrid thin film transistor may be applied in a driving circuit or a pixel unit of a display panel.

It is noted that in the embodiment shown in FIG. 3A to FIG. 3D, the first semiconductor layer 104 is a double layer structure composing of the crystallized silicon layer 104a and the silicon layer 104b (or the doped amorphous silicon layer 104c), which should not be construed as a limitation to the invention. According to another embodiment, the first semiconductor layer 104 may also be a three layer structure composing of the crystallized silicon layer 104a, the silicon layer 104b and the doped amorphous silicon layer 104c.

Figure 3E:
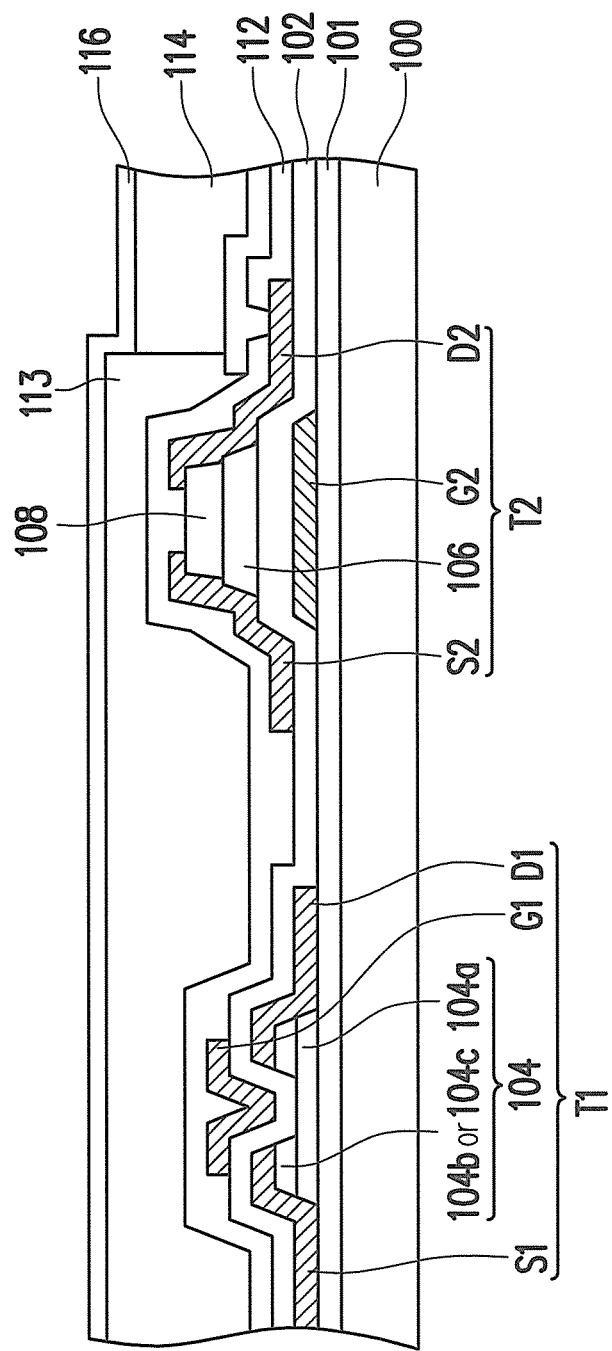

If the hybrid thin film transistor is applied in a pixel unit of a display panel, the step shown in FIG. 3E is further performed after FIG. 3D. That is, a passivation layer 110 is formed on the first thin film transistor T1 and the second thin film transistor T2. A first electrode layer 112 electrically connected to the second drain D2 of the second thin film transistor T2 is formed on the passivation layer 110. A planarization layer 113 is formed on the passivation layer 110 and exposes the first electrode layer 112. A light emitting layer 114 is formed on the exposed first electrode layer 112, and a second electrode layer 116 is formed on the light emitting layer 114. The first electrode layer 112, the light emitting layer 114 and the second electrode layer 116 form an electroluminescence device.

Figure 4A:
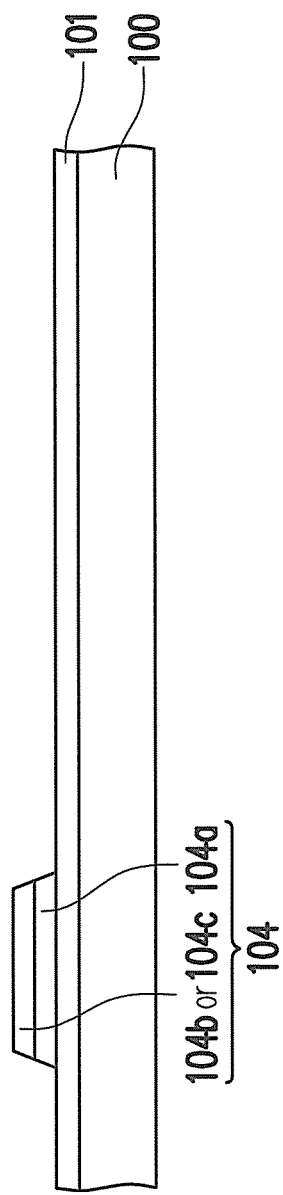
FIG. 4A to FIG. 4E are schematic cross-sectional diagrams showing a method of manufacturing a hybrid thin film transistor according to another embodiment of the present invention.

FIG. 4A to FIG. 4E are schematic cross-sectional diagrams showing a method of manufacturing a hybrid thin film transistor according to another embodiment of the present invention. The embodiment depicted in FIG. 4A to FIG. 4E is similar to the embodiment depicted in FIG. 1A to FIG. 1F, and the same components indicated in FIG. 1A to FIG. 1F are denoted by the same numerals and are not repeated herein. As shown in FIG. 4A, the method of manufacturing a hybrid thin film transistor in the embodiment comprises forming a buffer layer 101 on a substrate 100 and forming a first semiconductor layer 104 on the buffer layer 101. The first semiconductor layer 104 comprises the crystallized silicon layer 104a which comprises a poly-silicon material, a microcrystalline silicon material or other crystallized silicon materials. According to the embodiment, the first semiconductor layer 104 further comprises a silicon layer 104b or a doped amorphous silicon layer 104c. The silicon layer 104b comprises a microcrystalline silicon material or an amorphous silicon material, which is a silicon material not doped with a dopant. The doped amorphous silicon layer 104c comprises an amorphous silicon material doped with a p-type dopant or an amorphous silicon material doped with an n-type dopant.

Figure 4B:
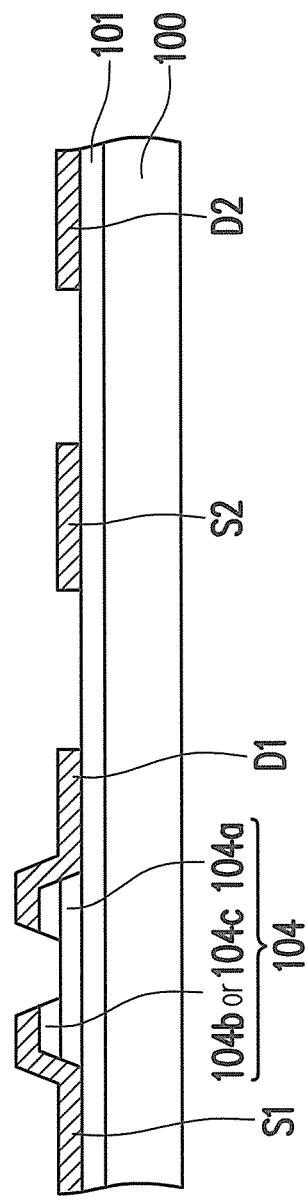

As shown in FIG. 4B, a first source S1 and a first drain D1 are formed on the first semiconductor layer 104, and a second source S2 and a second drain D2 are formed on the buffer layer 101. The first source S1, the first drain D1, the second source S2 and the second drain D2 are formed, for example, by depositing a conductive layer and patterning the conductive layer with a photolithography process and an etching process. In the patterning step, the silicon layer 104b (or the doped amorphous silicon layer 104c) between the first source S1 and the first drain D1 is also removed, so as to expose the crystallized silicon layer 104a.

Figure 4C:
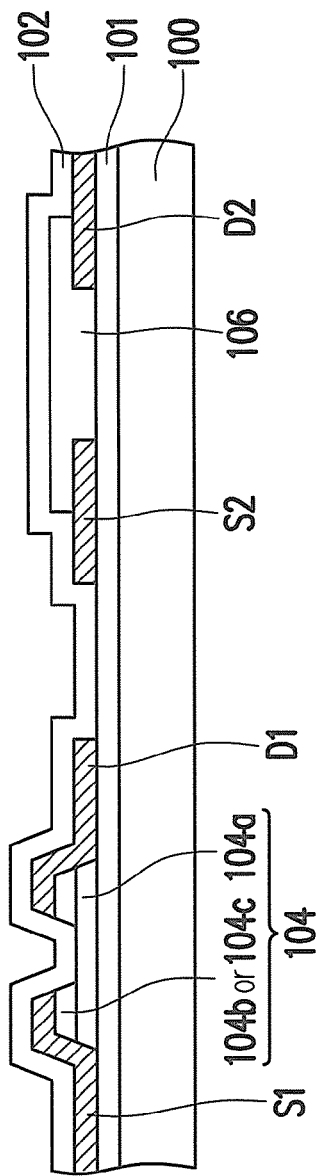

As shown in FIG. 4C, a second semiconductor layer 106 is formed between the second source S2 and the second drain D2. The second semiconductor layer 106 comprises an n-type metal oxide semiconductor material or a p-type metal oxide semiconductor material, which is based on the semi-conductive type of the doped amorphous silicon layer 104c of the first semiconductor layer 104. Next, an insulating layer 102 is formed on the buffer layer 101 to cover the first source S1, the first drain D1 and the second semiconductor layer 106.

Figure 4D:
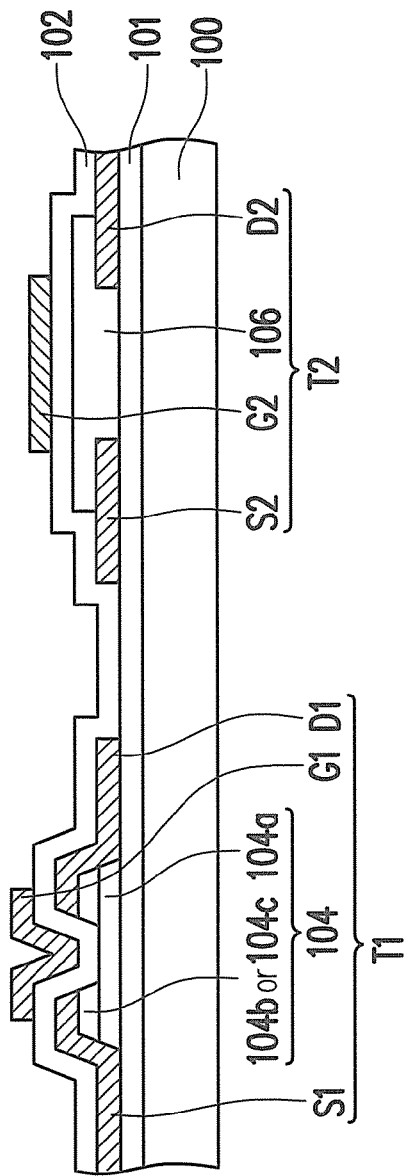

As shown in FIG. 4D, a first gate G1 is formed on the insulating layer 102 above the first semiconductor layer 104, and a second gate G2 is formed on the insulating layer 102 above the second semiconductor layer 106.

After the above step of FIG. 4D is finished, a hybrid thin film transistor which includes a first thin film transistor T1 and a second thin film transistor T2 is formed. The first thin film transistor T1 and the second thin film transistor T2 are respectively a top gate thin film transistor. The hybrid thin film transistor may be applied in a driving circuit or a pixel unit of a display panel.

It is noted that in the embodiment shown in FIG. 4A to FIG. 4D, the first semiconductor layer 104 is a double layer structure composing of the crystallized silicon layer 104a and the silicon layer 104b (or the doped amorphous silicon layer 104c), which should not be construed as a limitation to the invention. According to another embodiment, the first semiconductor layer 104 may also be a three layer structure composing of the crystallized silicon layer 104a, the silicon layer 104b and the doped amorphous silicon layer 104c.

Figure 4E:
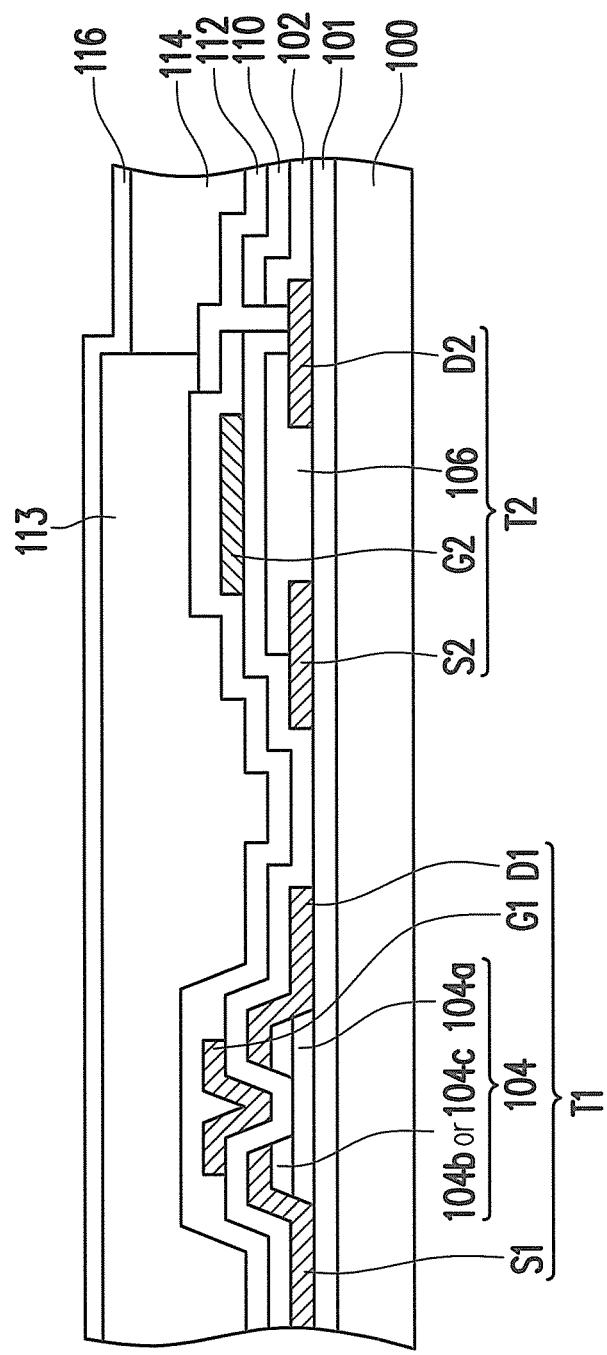

If the hybrid thin film transistor is applied in a pixel unit of a display panel, the step shown in FIG. 4E is further performed after FIG. 4D. That is, a passivation layer 110 is formed on the first thin film transistor T1 and the second thin film transistor T2. A first electrode layer 112 electrically connected to the second drain D2 of the second thin film transistor T2 is formed on the passivation layer 110. A planarization layer 113 is formed on the passivation layer 110 and exposes the first electrode layer 112. A light emitting layer 114 is formed on the exposed first electrode layer 112, and a second electrode layer 116 is formed on the light emitting layer 114. The first electrode layer 112, the light emitting layer 114 and the second electrode layer 116 form an electroluminescence device.

Figure 5A:
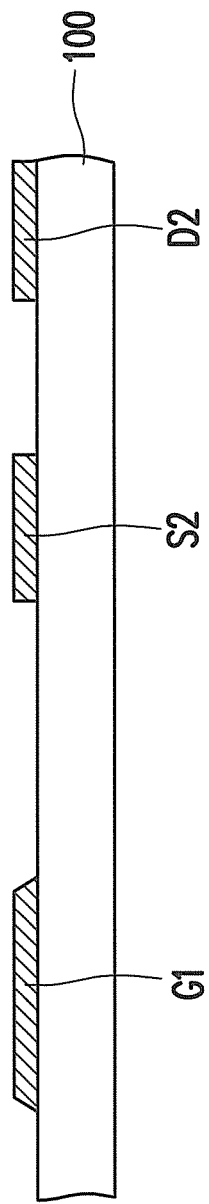
FIG. 5A to FIG. 5E are schematic cross-sectional diagrams showing a method of manufacturing a hybrid thin film transistor according to another embodiment of the present invention.

FIG. 5A to FIG. 5E are schematic cross-sectional diagrams showing a method of manufacturing a hybrid thin film transistor according to another embodiment of the present invention. The embodiment depicted in FIG. 5A to FIG. 5E is similar to the embodiment depicted in FIG. 1A to FIG. 1F, and the same components indicated in FIG. 1A to FIG. 1F are denoted by the same numerals and are not repeated herein. As shown in FIG. 5A, the method of manufacturing a hybrid thin film transistor in the embodiment comprises forming a first gate G1 on a substrate 100 and forming a second source S2 and a second drain D2 on the substrate 100. The first gate G1, the second source S2 and the second drain D2 are formed, for example, by depositing a conductive layer and patterning the conductive layer with a photolithography process and an etching process.

Figure 5B:
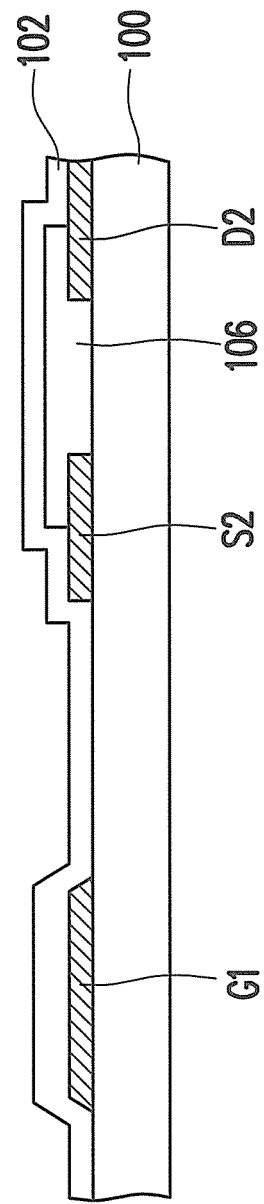

As shown in FIG. 5B, a second semiconductor layer 106 is formed between the second source S2 and the second drain D2. The second semiconductor layer 106 comprises an n-type metal oxide semiconductor material or a p-type metal oxide semiconductor material. An insulating layer 102 is formed on the substrate 100 to cover the first gate G1 and the second semiconductor layer 106.

Figure 5C:
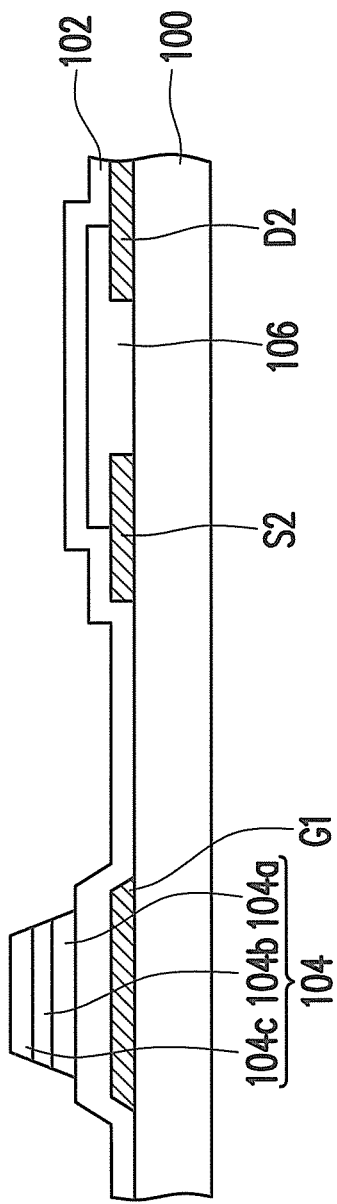

As shown in FIG. 5C, a first semiconductor layer 104 is formed on the insulating layer 102 above the first gate G1. According to the embodiment, the first semiconductor layer 104 comprises a crystallized silicon layer 104a, a silicon layer 104b or a doped amorphous silicon layer 104c.

Figure 5D:
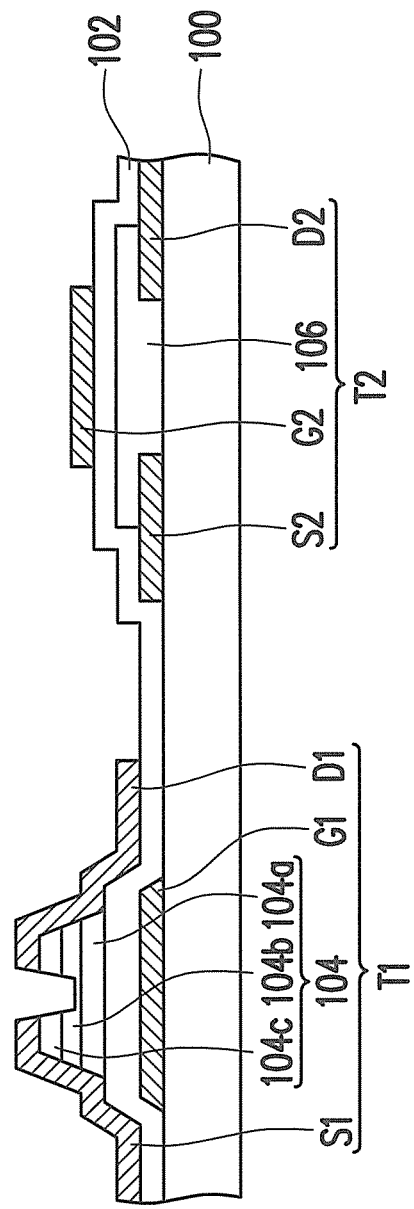

As shown in FIG. 5D, a first source S1 and a first drain D1 are formed on the first semiconductor layer 104, and a second gate G2 is formed on the insulating layer 102 above the second semiconductor layer 106. The first source S1, the first drain D1, and the second gate G2 are formed, for example, by depositing a conductive layer and patterning the conductive layer with a photolithography process and an etching process. In the patterning step, the doped amorphous silicon layer 104c between the first source S1 and the first drain D1 is also removed, so as to expose the silicon layer 104b or the crystallized silicon layer 104a.

After the step of FIG. 5D is finished, a hybrid thin film transistor which includes a first thin film transistor T1 and a second thin film transistor T2 is formed. The first thin film transistor T1 is a bottom gate thin film transistor, while the second thin film transistor T2 is top gate thin film transistor. The hybrid thin film transistor may be applied in a driving circuit or a pixel unit of a display panel.

It is noted that in the embodiment shown in FIG. 5A to FIG. 5D, the first semiconductor layer 104 is a three layer structure composing of the crystallized silicon layer 104a, the silicon layer 104b and the doped amorphous silicon layer 104c, which should not be construed as a limitation to the invention. According to another embodiment, the first semiconductor layer 104 may also be a double layer structure composing of the crystallized silicon layer 104a and the silicon layer 104b or double layer structure composing of the crystallized silicon layer 104a and the doped amorphous silicon layer 104c.

Figure 5E:
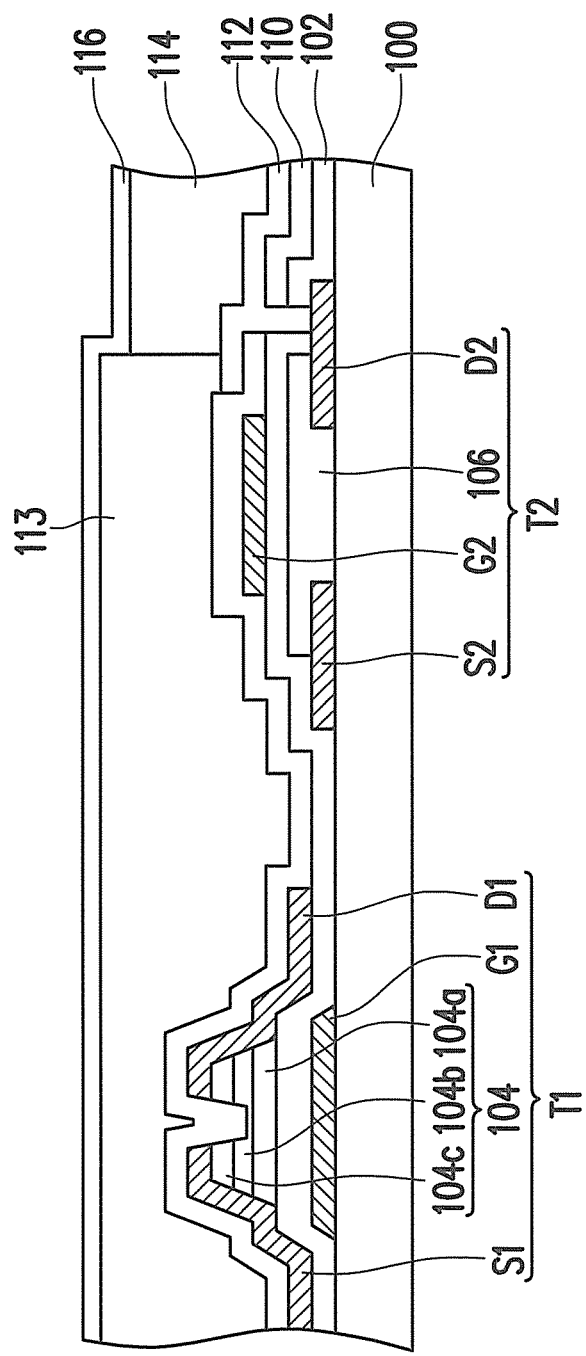

If the hybrid thin film transistor is applied in a pixel unit of a display panel, the step shown in FIG. 5E is performed after FIG. 5D. That is, a passivation layer 110 is formed on the first thin film transistor T1 and the second thin film transistor T2. A first electrode layer 112 electrically connected to the second drain D2 of the second thin film transistor T2 is formed on the passivation layer 110. A planarization layer 113 is formed on the passivation layer 110 and exposes the first electrode layer 112. A light emitting layer 114 is formed on the exposed first electrode layer 112, and a second electrode layer 116 is formed on the light emitting layer 114. The first electrode layer 112, the light emitting layer 114 and the second electrode layer 116 form an electroluminescence device.

It is noted that in the above embodiments, the doped amorphous silicon layer 104c may be formed with a non ion-implement process but not formed by a conventional ion implement process, that is, the doped amorphous silicon layer 104c can be formed by directly depositing a doped amorphous silicon material without using conventional ion-doping process.

Figure 6:
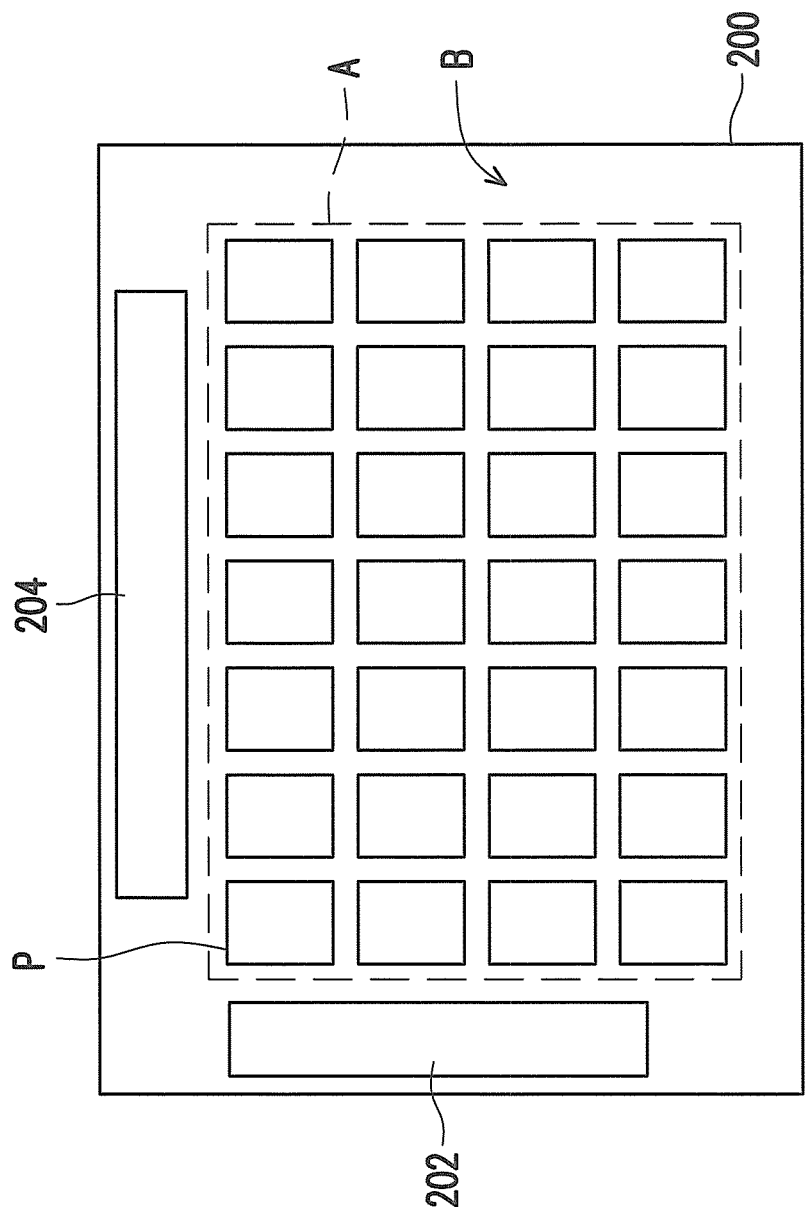
FIG. 6 is a top view showing a display panel according to an embodiment of the present invention.

FIG. 6 is a top view showing a display panel according to an embodiment of the present invention. Referring to FIG. 6, a display panel 200 of the embodiment comprises a display region A and a peripheral region B around the display region A. The display panel 200 includes a pixel array disposed in the display region A. The pixel array comprises a plurality of pixel unit P. According to an embodiment, each of the pixel units P comprises a scan line, a data line, at least one active device and an electrode layer electrically connected to the active device.

In addition, at least one driving circuit 202, 204 electrically connected to the pixel unit P is disposed in the peripheral region B. The driving circuit 202, 204 includes at least one driving device and at least one conductive line for providing driving signals to the pixel unit P, so as to drive the pixel array to display an image. In the embodiment, the driving circuit comprises a gate driving circuit 202 and a source driving circuit 204 disposed at two sides of the display region A, which should not be construed as a limitation to the invention. According to another embodiment, the driving circuit 202, 204 may also be disposed at one side or three sides of the display region A or around the display region A.

In the display panel 200, the hybrid thin film transistor as shown in FIG. 1E, FIG. 2D, FIG. 3D, FIG. 4D, or FIG. 5D may be used as an driving device of the driving circuit 202, 204. Because the hybrid thin film transistor shown in FIG. 1E, FIG. 2D, FIG. 3D, FIG. 4D, or FIG. 5D has high carrier mobility, it can be applied in the driving circuit 202, 204.

Figure 7:
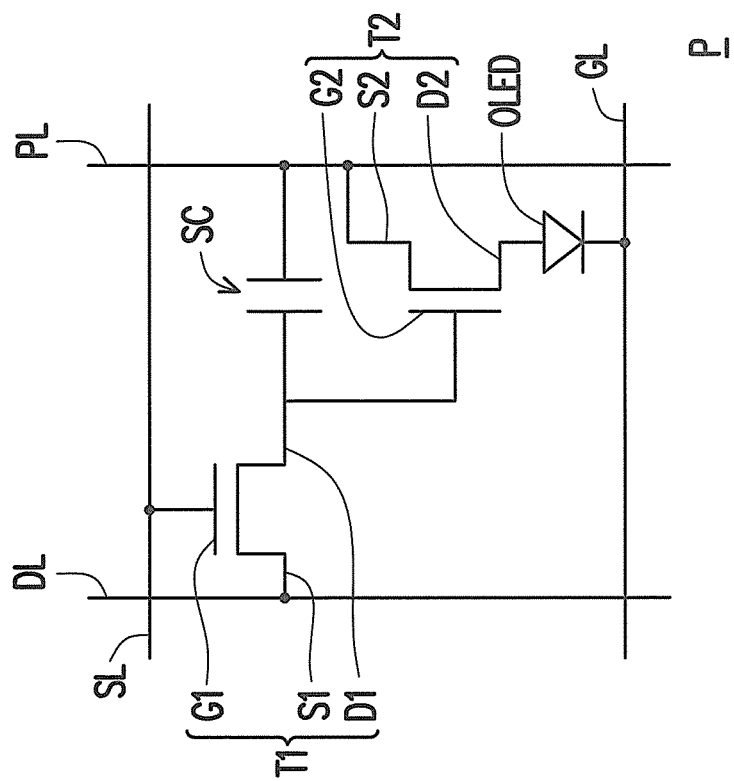
FIG. 7 is a schematic circuit diagram of a pixel unit according to an embodiment of the present invention.

Moreover, in the display panel 200, the hybrid thin film transistor shown in FIG. 1E, FIG. 2D, FIG. 3D, FIG. 4D, or FIG. 5D may also be used as an active device in the pixel unit P. In other words, the pixel unit P may be the structure as shown in FIG. 1F, FIG. 2E, FIG. 3E, FIG. 4E, or FIG. 5E, which comprises a hybrid thin film transistor and an electroluminescence device. The schematic circuit diagram of the pixel unit P is shown in FIG. 7, the pixel unit P comprises the hybrid thin film transistor including a first thin film transistor T1 and a second thin film transistor T2. The pixel unit P further comprises a scan line SL, a data line DL, a power line PL, a signal line GL, a capacitor SC and an electroluminescence device OLED. The first thin film transistor T1 includes a first gate G1, a first source S1, a first drain D1 and a first semiconductor layer (not shown in FIG. 7). The second thin film transistor T2 includes a second gate G2, a second source S2, a second drain D2 and a second semiconductor layer (not shown in FIG. 7). The first gate G1 is electrically connected to the scan line SL, and the first source S1 is electrically connected to the data line DL. The second gate G2 is electrically connected to the first drain D1, the second source S2 is electrically connected to the power line PL, and the second drain D2 is electrically connected to one terminal of the electroluminescence device OLED. The other terminal of the electroluminescence device OLED is electrically connected to the signal line GL (for example, a grounding line). One terminal of the capacitor SC is electrically connected to the power line PL, and the other terminal of the capacitor SC is electrically connected to the second gate G2 and the first drain D1. Therefore, the first thin film transistor T1 and the second thin film transistor T2 are driving devices of the pixel unit P.

According to the embodiment, the hybrid thin film transistor shown in FIG. 1E, FIG. 2D, FIG. 3D, FIG. 4D, or FIG. 5D is used as an driving device of the driving circuit 202, 204 in the peripheral region B of the display panel 200, and the pixel unit P in the display region A of the display panel 200 has a structure as shown in FIG. 1F, FIG. 2E, FIG. 3E, FIG. 4E, or FIG. 5E. However, it is not limited in the present invention.

According to another embodiment, the hybrid thin film transistor of FIG. 1E, FIG. 2D, FIG. 3D, FIG. 4D, or FIG. 5D is used as an driving device of the driving circuit 202, 204 in the peripheral region B of the display panel 200, and a conventional thin film transistor is used as a driving device (active device) in the pixel unit P in the display region A of the display panel 200. Alternatively, the pixel unit P in the display region A of the display panel 200 has a structure as shown in FIG. 1F, FIG. 2E, FIG. 3E, FIG. 4E, or FIG. 5E, and a conventional thin film transistor is used as a driving device of the driving circuit 202, 204 in the peripheral region B of the display panel 200.

In light of the foregoing, the hybrid thin film transistor comprises a crystallized silicon thin film transistor (the first thin film transistor) and a metal oxide thin film transistor (the second thin film transistor). The hybrid thin film transistor has higher carrier mobility comparing with the conventional amorphous thin film transistor, and the manufacturing process for the hybrid thin film transistor is simpler comparing with the manufacturing process for the conventional low temperature poly-silicon thin film transistor. Therefore, the hybrid thin film transistor of the present invention is suitable for applying in driving circuits, pixel units or both of them, and the manufacturing cost is low.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A hybrid thin film transistor, comprising:
    a first thin film transistor, comprising:
        a first gate, a first source and a first drain; and
        a first semiconductor layer, disposed between the first gate, the first source and the first drain, wherein the first semiconductor layer includes a crystallized silicon layer and a non-doped silicon layer disposed on the crystallized silicon layer, the crystallized silicon layer comprises a poly-silicon material or a microcrystalline silicon material, and the non-doped silicon layer comprises a microcrystalline silicon material or an amorphous silicon material;
    a second thin film transistor, comprising:
        a second gate, a second source and a second drain; and
        a second semiconductor layer, disposed between the second gate, the second source and the second drain, wherein the second semiconductor layer includes a metal oxide semiconductor layer; and
    an insulating layer, disposed on the first gate and the second gate, wherein both of the second source and the second drain are disposed between the metal oxide semiconductor layer and the insulating layer, and the first source, the first drain, the second source and the second drain are directly in contact with the insulating layer.

2. The hybrid thin film transistor as claimed in claim 1, wherein the first semiconductor layer further comprises a doped amorphous silicon layer disposed on the non-doped silicon layer, and the doped amorphous silicon layer comprises an amorphous silicon material doped with a p-type dopant.

3. The hybrid thin film transistor as claimed in claim 2, wherein the metal oxide semiconductor layer of the second semiconductor layer comprises indium-gallium-zinc oxide (IGZO), zinc oxide (ZnO), indium-zinc oxide (IZO), gallium-zinc oxide (GZO), zinc-tin oxide (ZTO) or indium-tin oxide (ITO).

4. The hybrid thin film transistor as claimed in claim 1, wherein the first semiconductor layer further comprises a doped amorphous silicon layer disposed on the non-doped silicon layer, such that the first semiconductor layer is a three-layer structure, and wherein the doped amorphous silicon layer comprises an amorphous silicon material doped with a n-type dopant.

5. The hybrid thin film transistor as claimed in claim 4, wherein the metal oxide semiconductor layer of the second semiconductor layer comprises tin oxide (SnO), cupper-aluminum-gallium-indium oxide, tin-aluminum-indium oxide, SrCu2O2, LaCuOS or LaCuOSe.

6. The hybrid thin film transistor as claimed in claim 4, wherein an opening is formed in the doped amorphous silicon layer and the non-doped silicon layer so as to expose the crystallized silicon layer.

7. The hybrid thin film transistor as claimed in claim 1, wherein the first thin film transistor and the second thin film transistor are respectively a bottom gate thin film transistor or a top gate thin film transistor.

8. A display panel having a display region and a peripheral region around the display region, the display panel comprising:
    a pixel array, disposed in the display region; and
    at least one driving device, disposed in at least one of the display region and the peripheral region, wherein the at least one driving device is a hybrid thin film transistor as claimed in claim 1.

9. The display panel as claimed in claim 8, wherein the pixel array comprises a plurality of pixel units, the at least one driving device is disposed in the display region and is not disposed in the peripheral region, and each of the pixel units comprises an electroluminescence device electrically connected to the driving device.

10. The display panel as claimed in claim 8, wherein the pixel array comprises a plurality of pixel units, the at least one driving device comprises a plurality of pixel driving devices and at least one circuit driving device, wherein each pixel unit comprises one pixel driving device and an electroluminescence device electrically connected to the pixel driving device, and the at least one circuit driving device is disposed in the peripheral region.

11. The display panel as claimed in claim 8, wherein the pixel array comprises a plurality of pixel units, the at least one driving device is disposed in the peripheral region and is not disposed in the display region.

12. The hybrid thin film transistor as claimed in claim 1, wherein the second source and the second drain are in contact with side-walls of the second semiconductor layer, respectively.

13. A method of manufacturing a hybrid thin film transistor, comprising:

forming a first thin film transistor on a substrate, the first thin film transistor comprising a first gate, a first source, a first drain and a first semiconductor layer disposed between the first gate, the first source and the first drain, wherein the first semiconductor layer comprises a crystallized silicon layer and a non-doped silicon layer disposed on the crystallized silicon layer, the crystallized silicon layer comprises a poly-silicon material or a microcrystalline silicon material, and the non-doped silicon layer comprises a microcrystalline silicon material or an amorphous silicon material;

forming a second thin film transistor on the substrate, the second thin film transistor comprising a second gate, a second source, a second drain and a second semiconductor layer disposed between the second gate, the second source and the second drain, wherein the second semiconductor layer includes a metal oxide semiconductor layer; and forming an insulating layer on the first gate and the second gate, wherein both of the second source and the second drain are disposed between the metal oxide semiconductor layer and the insulating layer, wherein the first source, the first drain, the second source and the second drain are directly in contact with the insulating layer.

14. The method as claimed in claim 13, wherein the steps of forming the first thin film transistor, the second thin film transistor, and the insulating layer comprise:

forming the first gate and the second gate on the substrate;

forming the insulating layer to cover the first gate and the second gate;

forming the first semiconductor layer on the insulating layer above the first gate, and the first semiconductor layer comprises the crystallized silicon layer and the non-doped silicon layer;

forming the second semiconductor layer on the insulating layer above the second gate; and forming the first source and the first drain on the first semiconductor layer, and forming the second source and the second drain on the second semiconductor layer.

15. The method as claimed in claim 14, wherein the first semiconductor layer further comprises a doped amorphous silicon layer on the non-doped silicon layer, such that the first semiconductor layer is a three-layer structure, and the doped amorphous silicon layer is formed by depositing an amorphous silicon material having a dopant.

16. The method as claimed in claim 14, further comprising forming an etching stop layer on the second semiconductor layer before forming the second source and the second drain.

17. The method as claimed in claim 13, wherein the steps of forming the first thin film transistor and the second thin film transistor comprise:

forming the first semiconductor layer on the substrate, and the first semiconductor layer comprises the crystallized silicon layer;

forming the first source and the first drain on the first semiconductor layer, and forming the second gate on the substrate;

forming an insulating layer to cover the first semiconductor layer, the first source, the first drain and the second gate;

forming the second semiconductor layer on the insulating layer above the second gate; and forming the second source and the second drain on the second semiconductor layer, and forming the first gate on the insulating layer above the first semiconductor layer.

18. The method as claimed in claim 17, wherein the first semiconductor layer further comprises a silicon layer or a doped amorphous silicon layer on the crystallized silicon layer, and the silicon layer comprises a microcrystalline silicon material or an amorphous silicon material.

19. The method as claimed in claim 17, further comprising forming an etching stop layer on the second semiconductor layer before forming the second source and the second drain.

20. The method as claimed in claim 13, wherein the steps of forming the first thin film transistor and the second thin film transistor comprise:

forming the first semiconductor layer on the substrate, and the first semiconductor layer comprises the crystallized silicon layer;

forming the first source and the first drain on the first semiconductor layer, and forming the second source and the second drain on the substrate;

forming the second semiconductor layer between the second source and the second drain;

forming an insulating layer to cover the first source, the first drain and the second semiconductor layer; and forming the first gate on the insulating layer above the first semiconductor layer, and forming the second gate on the insulating layer above the second semiconductor layer.

21. The method as claimed in claim 20, wherein the first semiconductor layer further comprises a silicon layer or a doped amorphous silicon layer on the crystallized silicon layer, and the silicon layer comprises a microcrystalline silicon material or an amorphous silicon material.

22. The method as claimed in claim 13, wherein the steps of forming the first thin film transistor and the second thin film transistor comprise:

forming the first gate on the substrate, and forming the second source and the second drain on the substrate;

forming the second semiconductor layer between the second source and the second drain;

forming an insulating layer to cover the first gate and the second semiconductor layer;

forming the first semiconductor layer on the insulating layer above the gate, and the first semiconductor layer comprises the crystallized silicon layer; and forming the first source and the first drain on the first semiconductor layer, and forming the second gate on the insulating layer above the second semiconductor layer.

23. The method as claimed in claim 22, wherein the first semiconductor layer further comprises a silicon layer or a doped amorphous silicon layer on the crystallized silicon layer, and the silicon layer comprises a microcrystalline silicon material or an amorphous silicon material.

24. A hybrid thin film transistor formed on a substrate, comprising:
- a first gate and a second gate formed on the substrate;
- an insulating layer covering the first gate and the second gate;
- a first semiconductor layer and a second semiconductor layer formed on the insulating layer, wherein the first semiconductor layer includes a crystallized silicon layer and a non-doped silicon layer disposed on the crystallized silicon layer, the crystallized silicon layer comprises a poly-silicon material or a microcrystalline silicon material, the non-doped silicon layer comprises a microcrystalline silicon material or an amorphous silicon material, and the second semiconductor layer includes a metal oxide semiconductor layer;
- an etching stop layer formed on and in contact with the second semiconductor layer;
- a first source and a first drain formed on and in contact with the first semiconductor layer;
- a second source and a second drain formed on and in contact with the etching stop layer, wherein the second source and the second drain are in contact with sidewalls of the second semiconductor layer, respectively; and
- a passivation layer completely covering and in contact with the insulating layer, the first source, the first drain, the etching stop layer, the second source and the second drain.

* * * * *